United States Patent [19]

Knee

[11] Patent Number: 5,387,946
[45] Date of Patent: Feb. 7, 1995

[54] METHOD AND APPARATUS FOR MEASURING NOISE IN VIDEO SIGNALS

[75] Inventor: Michael Knee, Strasbourg, France

[73] Assignee: Thomson Consumer Electronics S.A., Courbevoie, France

[21] Appl. No.: 35,024

[22] Filed: Mar. 22, 1993

[30] Foreign Application Priority Data

Mar. 23, 1992 [EP] European Pat. Off. ............ 92400785

[51] Int. Cl.⁶ .............................................. H04N 5/213
[52] U.S. Cl. ..................................... 348/622; 348/180
[58] Field of Search ............... 358/167, 36, 139; 348/180, 466, 618, 619, 620, 622; H04N 17/100, 5/213

[56] References Cited

U.S. PATENT DOCUMENTS

| 4,074,201 | 2/1978 | Lennon | 325/363 |
| 4,249,209 | 2/1981 | Storey | 358/167 |
| 4,442,454 | 4/1984 | Powell | 358/167 |
| 4,873,574 | 10/1989 | Darby | 358/139 |
| 5,161,018 | 11/1992 | Matsunaga | 358/167 |

FOREIGN PATENT DOCUMENTS 0109037 5/1984 European Pat. Off. ...... G01R 29/26

Primary Examiner—Victor R. Kostak
Attorney, Agent, or Firm—Joseph S. Tripoli

[57] ABSTRACT

A method of measuring noise in a television signal includes the steps of storing an estimated noise value N. The activity values A of blocks of pixels are measured and periodically compared with the estimated noise value N. A first correction value $C_{v1}$ is added to the estimated value when $A > N$ and a second correction value $C_{v2}$ is subtracted from the noise value N when $A \leq N$. The second correction value $C_{v2}$ is substantially greater than the first correction value $C_{v1}$.

7 Claims, 3 Drawing Sheets

METHOD AND APPARATUS FOR MEASURING NOISE IN VIDEO SIGNALS

The present invention relates to a method and to an apparatus for noise measurement.

BACKGROUND

Different methods of noise measurement are known. The activity of blocks of pixels can be measured and applied for noise measurement. However, it is difficult to distinguish between noise and picture content.

INVENTION

It is one object of the invention to provide an improved method of noise measurement based on the activity of blocks of pixel values.

The invention uses the finding that the active picture content also contains signal parts of which the main activity is caused by noise. The probability distribution of measured block activity values of picture blocks is combined with a method of obtaining a running estimate of a particular point in the probability distribution and used for noise measurement. The noise of signal parts with active picture content can also be measured.

In principle the inventive method consists of a noise measurement, wherein the activity values A of blocks of pixels are calculated periodically and compared with an estimated noise value N stored in an accumulator circuit and wherein in case $A>N$ a first correction value is added in said accumulator circuit to said noise value N and in case $A \leq N$ a second correction value, which is 10 to 100 times greater than said first correction value, is subtracted in said accumulator circuit from said noise value N.

In principle the inventive apparatus comprises means for capturing blocks of the active picture at intervals determined by a pseudorandom number generator, means for calculating the mean value for each block and means for subtracting this mean value from the pixel values of the current block, means for calculating absolute values or squares of the difference values from the output of said subtracting means, means for summing up for each block said absolute values or said squares thereby providing said activity values A, a comparator for comparing said activity values A and estimated noise values N which have been calculated in an accumulator circuit, wherein controlled by the output logical value of said comparator in case $A>N$ said first correction value is added in said accumulator circuit to said noise value N and in case $A \leq N$ said second correction value is subtracted in said accumulator circuit from said noise value N.

DRAWINGS

Preferred embodiments of the invention are described with reference to the accompanying drawings, in which.

Figure 6:
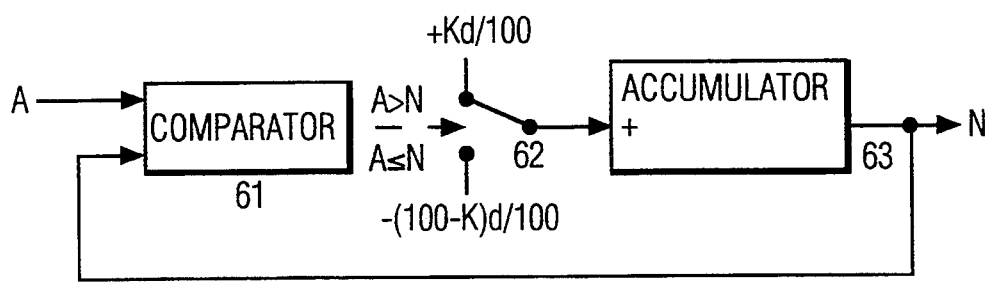
Figure 7:
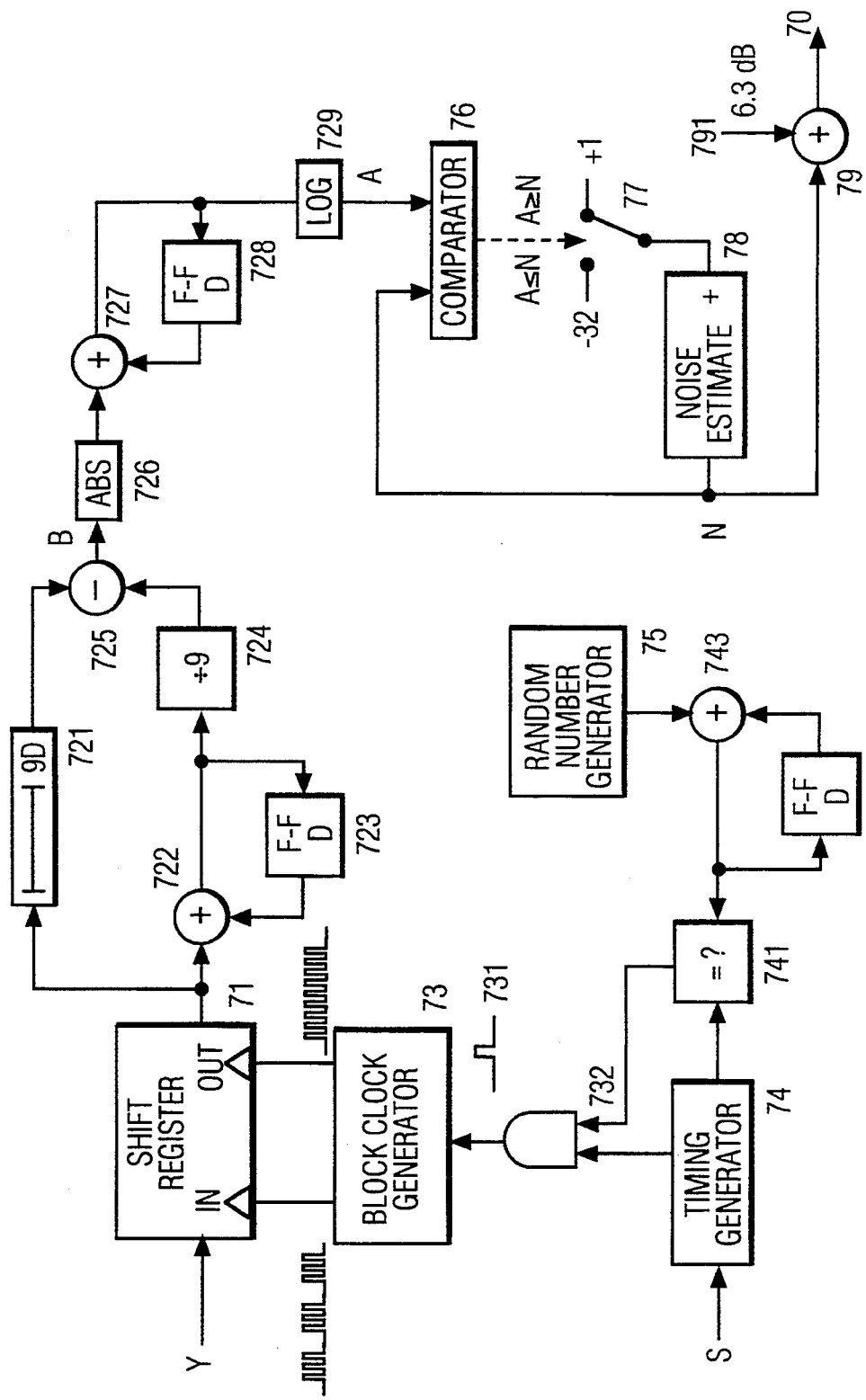

FIG. 6 explains the process of statistical distribution;

FIG. 7 is a preferred embodiment of the inventive noise measurement apparatus.

PREFERRED EMBODIMENTS

Figure 1:
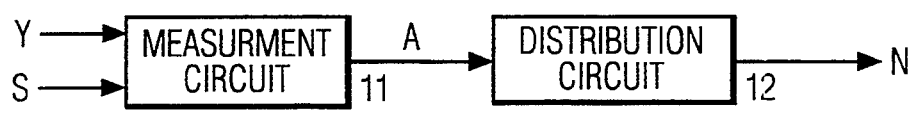
FIG. 1 shows the general function of the noise measurement.

In FIG. 1 the activity A of an incoming picture signal Y, e.g. a television signal, typically the luminance component, is measured periodically (e.g. 192 times per frame in case of 3*3 pixel blocks) in a measurement circuit 11 under the timing control of a sync signal S. The resulting activity values A are processed in a distribution circuit 12 according to their statistical distribution to produce a noise estimate N which varies either with the same speed or much more slowly than A, e.g. once per second.

Figure 2:
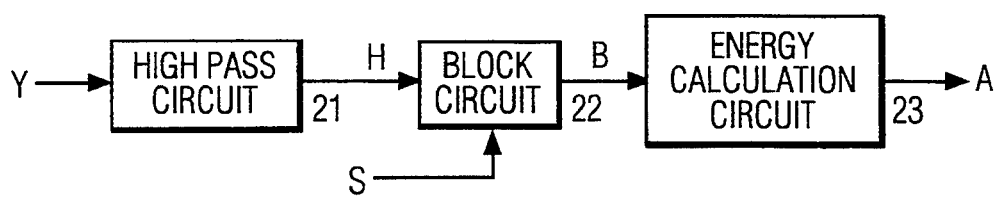
FIG. 2 shows the measurement of activity.

Measurement circuit 11 is explained in more detail in FIG. 2. The picture signal Y passes a filter 21, typically a high pass filter whose output H approximates to the noise content of the picture signal more closely than the original picture signal does. Small blocks B of the filtered picture signal H are then captured by a block circuit 22 which is controlled by the sync signal S. The energy of each block B is calculated in an energy calculation circuit 23. The blocks may include any or all of the horizontal, vertical and temporal dimensions.

Figure 3:
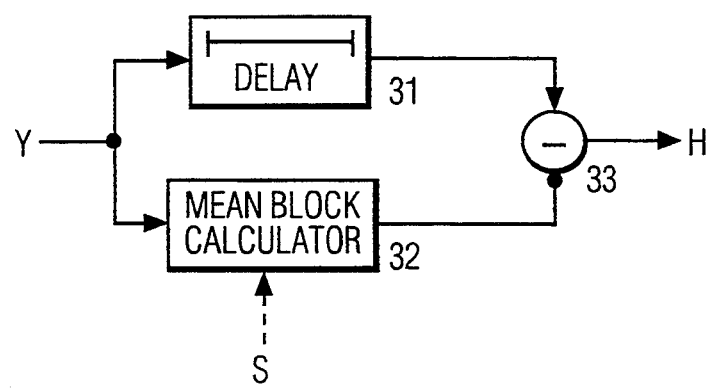
FIG. 3 depicts a digital filter.

In one version of the invention, the picture signal is digital and is filtered by subtracting from it the mean of small blocks of the picture, as shown in FIG. 3. The mean of each block is calculated in a block mean calculator 32 and subtracted with a subtractor 33 from the picture signal Y which has been delayed appropriately by a delay 31. The blocks may be the same as those described below and may be captured in the same manner. In another version, the filtered signal may consist of the difference between the signal itself and an optimum linear or adaptive prediction of the signal.

In a further version, the video signal lines can be filtered with an one-dimensional analog high pass filter.

Figure 4:
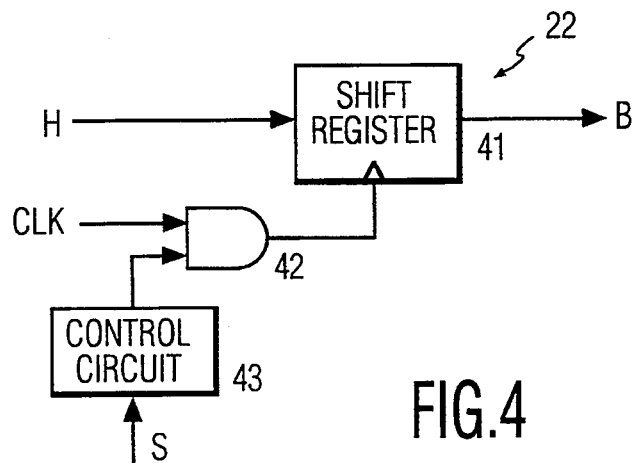
FIG. 4 shows the capturing of pixel blocks.

In one version of the invention, the blocks are captured in block circuit 22 by gating the clock Clk with AND gate 42 at the input to a serial shift register 41, as shown in FIG. 4. The second input of gate 42 is connected via control circuit 43 to the sync S. In this version, at most one block is captured every n lines, where n is the number of lines spanning the size of the block.

In another version, blocks are captured continuously by means of line delays.

In both versions, the block circuit 22 must ensure that only parts of the picture signal, which have been subjected to transmission noise and which have not been reconstructed in the receiver, are captured.

Figure 5:
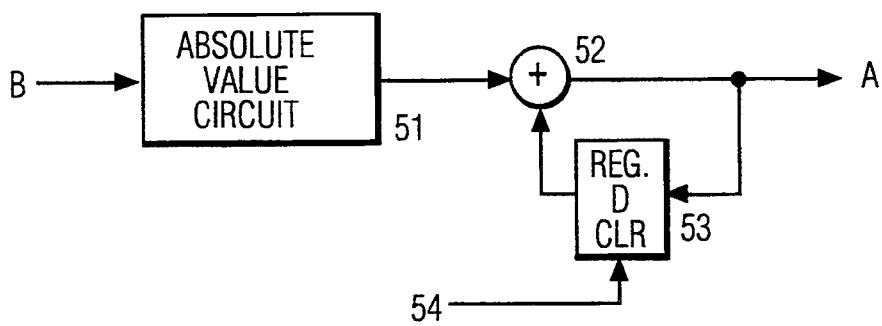
FIG. 5 shows in principle the block energy calculation.

The energy of a block is calculated in energy calculation circuit 23 by summing the squares of the sample values in the block. Other approximations may also be used. A simple but effective approximation is to sum the absolute values rather than the squares, as shown in FIG. 5. The pixel values of block B are fed to an absolute value circuit 51. The output values are summed up in an adder 52. Each sum is intermediately stored in a register 53, e.g. a D-flip flop. This register is cleared with a block start signal 54 at the beginning of each block.

The resulting approximation to the energy of each filtered block constitutes an estimate of the activity of the corresponding portion of the original picture. In one version of the invention, the final output A of this function is the logarithm of the estimated activity.

The samples of picture activity are processed, exploiting their statistical properties, in order to obtain a global estimate of noise on the picture which is as independent as possible of the detail in the picture. In one embodiment of the invention, the noise estimate consists of a running approximation N to the k % point on the probability distribution of the activity samples, where k is typically between 1 and 10.

This means that within a given period, k % of the activity samples A are below N and (100-k) % of the activity samples are greater than N.

Referring to FIG. 6, this approximation N is held in an accumulator 63 and is compared in a comparator 61 with the incoming A samples in turn. The output of comparator 61 controls a switch 62 which inputs either a first or a second correction value to accumulator 63. The following rule is applied:

When A>N: a first value of +k*d/100 is used

Otherwise: a second value of—(100-k)*d/100 is used where d is a small convergence parameter (typically of the order of 0.01) that allows N to change slowly. The effect of applying this rule in a steady-state condition is to keep N at the k % point of the distribution of values of A.

If A (and therefore N) is expressed logarithmically, the final process is to add a correction value, which depends on the block size, and the activity measure A, which may additionally be allowed to depend on the type of transmission noise expected. Theoretical approximations to the optimum value of the correction may be calculated. Advantageously it is estimated by applying the noise measurement system to a typical picture with transmission noise whose power is also known by other noise measurement methods.

Advantageously the final noise estimate N may be calculated as a function of approximations not only to the k % point of the probability distribution but to other parameters that depend on this distribution, such as the median (the 50% point) or the mean.

A specific embodiment of the invention is shown in FIG. 7, in which 3*3 blocks of the active picture are captured at intervals determined by a pseudorandom number generator 75. The output values of this generator are summed up in adder 743 and accumulated by a D-flip flop 742. A timing generator 74 receives a sync signal S and and provides active picture window information to an AND gate 732 and the sample count to a comparator 741 in which this sample count is compared with the output of adder 743. The output of comparator 741 is fed to the second input of gate 732 which outputs block start signals to a block clock generator 73. The block clock generator is connected to an input terminal 'In' and to an input terminal 'Out' of a shift register 71 which captures the 3*3 blocks as described for FIG. 4. From the output blocks of register 71 the mean value for each block is calculated using an adder 722 and a D-flip flop 723 for summing up the nine pixel values and a divider 724 which divides the sum by nine and outputs the block mean. This block mean is subtracted in a subtractor 725 from the pixel values of the current block which are appropriately delayed by delay 721. The high pass filtered block values B at the output of subtractor 725 pass an absolute value circuit 726 and are summed up for each block by adder 727 and D flip flop 728. The filtering operation consists of calculating the differences of block samples from the mean of each block and the energy is approximated by summing the absolute values of those differences.

The output of adder 727 passes a logarithmic value circuit 729 which gives values representing activity A. The statistical distribution processing consists of estimating the (approximately) 3% point on the distribution of the logarithmic values of the activity.

A comparator 76 compares activity A and the noise estimate N which has been calculated in accumulator 78. A switch 77 is controlled by the output logic value of comparator 76 and feeds either (in case A>N) the number '+1' or (in case A≦N) the number '−32' to the input of accumulator 78. The number '−32' has been chosen because 32*3% ≈100%. The start value of accumulator 78 can be zero. Finally, a constant correction value 791 equivalent to 6.3 dB is added in an adder 79 to the noise estimate N, this constant correction value having been calculated using artificial noise with a flat distribution added to a grey picture. The final noise estimate N is available at adder output 70.

The noise values N can also be accumulated and allowed to change at the input of adder 79 with a smaller period, e.g. once per second.

Additionally, further correction to the noise estimate N can be applied taking into account the mean activity of the picture, for example by subtracting $\frac{1}{4}$*(B-15) from the noise estimate, where B is the mean activity of the processed blocks expressed in dB.

I claim:

1. A method of applying a low noise signal to a television display by measuring noise in a television signal comprising the steps of:
    storing an estimated noise value N;
    measuring the activity values A of blocks of pixels;
    periodically comparing said activity value A with said estimated noise value N;
    adding a first correction value $C_{v1}$ to said estimated value when A>N and subtracting a second correction value $C_{v2}$ when A≦N, said second correction value $C_{v2}$ being in the order of 10 to 100 times greater than said first correction value $C_{v1}$; and
    determining said activity values A by subtracting the value of each pixel from the mean value of all pixels within the block.

2. The method of claim 1 wherein said activity values are determined by filtering said television signal and taking the difference between the filtered signal and a predicted value.

3. The method of claim 1 wherein said activity values are determined by filtering said television signal with a one-dimensional analog high pass filter.

4. The method of claim 1 wherein said activity values are determined by summing the absolute values of the differences obtained by said subtraction.

5. The method of claim 1 wherein said activity values A are determined at a first period and said noise values N are accumulated and change at a second period less than said first period.

6. The method of claim 5 further including the step of taking the logarithm of said activity value A before comparing said activity value to said noise value N, and adding a fixed correction value to said noise value N.

7. Apparatus for measuring noise in a video signal comprising:
    a pseudorandom noise generator;
    means responsive to said noise generator for receiving blocks of data representative of activity in said video signal at intervals determined by said noise generator;
    means for calculating the mean values of for each block of data;
    means for subtracting said mean values from values of the current block to establish difference values;

means for calculating absolute values of said difference values;
means for summing said absolute values for each block and providing activity values for each block;
means for storing estimated noise values;
means for comparing said activity values with said noise values; and
means responsive to said means for comparing for adding a first correction value to said estimated noise value when said activity value exceeds said noise value and for subtracting a second correction value from said value when said noise value exceeds said activity value, said second correction value being substantially greater than said first correction value.

* * * * *